United States Patent
Chen et al.

(10) Patent No.: US 8,854,880 B2
(45) Date of Patent: Oct. 7, 2014

(54) INTER-CELL INTERFERENCE CANCELLATION IN FLASH MEMORIES

(71) Applicant: LSI Corporation, San Jose, CA (US)

(72) Inventors: Zhengang Chen, San Jose, CA (US); Erich F. Haratsch, Bethlehem, PA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/778,860

(22) Filed: Feb. 27, 2013

(65) Prior Publication Data

US 2013/0176779 A1 Jul. 11, 2013

Related U.S. Application Data

(63) Continuation-in-part of application No. 12/920,407, filed on Jan. 4, 2011, now Pat. No. 8,724,381, and a continuation-in-part of application No. 13/001,278, filed on Feb. 25, 2011, now Pat. No. 8,462,549, and a continuation-in-part of application No. 13/063,888, filed on Aug. 31, 2011, and a continuation-in-part of application No. 13/731,551, filed on Dec. 31, 2012.

(51) Int. Cl.
*G11C 11/34* (2006.01)
*G11C 11/56* (2006.01)
*G11C 16/04* (2006.01)

(52) U.S. Cl.
CPC ............ *G11C 16/04* (2013.01); *G11C 11/5642* (2013.01)
USPC ................................ 365/185.03; 365/185.18

(58) Field of Classification Search
USPC ........................ 365/185.03, 185.18
See application file for complete search history.

(56) References Cited

U.S. PATENT DOCUMENTS

| 8,130,544 B2 * | 3/2012 | Chou et al. ............... 365/185.03 |
| 2011/0145487 A1 | 6/2011 | Haratsch et al. |
| 2011/0149657 A1 | 6/2011 | Haratsch et al. |

OTHER PUBLICATIONS

Lee et al., "Effects of Floating-Gate Interference on NAND Flash Memory Cell Operations," IEEE Electron Device Letters, vol. 23, No. 5, pp. 264-266 (2002).

* cited by examiner

*Primary Examiner* — Son Dinh
*Assistant Examiner* — Nam Nguyen
(74) *Attorney, Agent, or Firm* — Ryan, Mason & Lewis, LLP (57) ABSTRACT

Inter-cell interference cancellation is provided for flash memory devices. Data from a flash memory device is processed by obtaining one or more quantized threshold voltage values for at least one target cell of the flash memory device; obtaining one or more hard decision read values for at least one aggressor cell of the target cell; determining an aggressor state of the at least one aggressor cell; determining an interference amount based on the aggressor state; determining an adjustment to the quantized threshold voltage values based on the determined interference amount; and adjusting the quantized threshold voltage values based on the determined adjustment. The quantized threshold voltage values for at least one target cell are optionally re-used from a previous soft read retry operation. The adjusted quantized threshold voltage values are optionally used to determine reliability values and are optionally applied to a soft decision decoder and/or a buffer.

20 Claims, 12 Drawing Sheets

INTER-CELL INTERFERENCE CANCELLATION IN FLASH MEMORIES

CROSS-REFERENCE TO RELATED APPLICATIONS

The present application is a continuation-in-part patent application of U.S. patent application Ser. No. 12/920,407, filed Aug. 31, 2010, entitled "Methods and Apparatus for Storing Data in a Multi-Level Cell Flash Memory Device With Cross-Page Sectors, Multi-Page Coding And Per-Page Coding;" U.S. patent application Ser. No. 13/001,278, filed Dec. 23, 2010, entitled "Methods and Apparatus for Read-Side Intercell Interference Mitigation in Flash Memories;" U.S. patent application Ser. No. 13/063,888, filed Mar. 14, 2011, entitled "Methods and Apparatus for Soft Data Generation in Flash Memories;" and U.S. patent application Ser. No. 13/731,551, filed Dec. 31, 2012, entitled "Multi-Tier Detection and Decoding in Flash Memories," each incorporated by reference herein.

FIELD

The present invention relates generally to flash memory devices and more particularly, to improved techniques for mitigating the effect of noise, inter-cell interference and other distortions in such flash memory devices with low overall processing delay.

BACKGROUND

A number of memory devices, such as flash memory devices, use analog memory cells to store data. Each memory cell stores an analog value, also referred to as a storage value, such as an electrical charge or voltage. The storage value represents the information stored in the cell. In flash memory devices, for example, each analog memory cell typically stores a certain voltage. The range of possible analog values for each cell is typically divided into threshold regions, with each region corresponding to one or more data bit values. Data is written to an analog memory cell by writing a nominal analog value that corresponds to the desired one or more bits.

The analog values stored in memory cells are often distorted. The distortions are typically due to, for example, back pattern dependency (BPD), noise and inter-cell interference (ICI). A number of techniques have been proposed or suggested for mitigating the effect of ICI by reducing the capacitive coupling between cells. Flash memory devices typically employ only hard-decision read operation. The analog threshold voltage (Vt) signal that represents the stored data typically cannot be sensed accurately without performing many read operations. In a flash storage system comprised of a flash controller and flash memory devices, if normal decoding fails, a soft read retry procedure can be employed with a number of hard-decision read operations.

A need remains for improved ICI mitigation techniques that reduce ICI using soft information obtained during the soft read retry procedure. A further need exists for ICI mitigation techniques for a given target cell that re-uses the soft information obtained during the soft read retry procedure for the target cell and only performs additional reads for aggressor cells.

SUMMARY

Generally, methods and apparatus are provided for inter-cell interference cancellation in flash memory devices. According to one aspect of the invention, data from a flash memory device is processed by obtaining one or more quantized threshold voltage values for at least one target cell of the flash memory device; obtaining one or more hard decision read values for at least one aggressor cell of the target cell; determining an aggressor state of the at least one aggressor cell; determining an interference amount based on the aggressor state; determining an adjustment to the one or more quantized threshold voltage values based on the determined interference amount; and adjusting the one or more quantized threshold voltage values based on the determined adjustment.

According to another aspect of the invention, the quantized threshold voltage values for at least one target cell are optionally re-used from a previous soft read retry operation. The quantized threshold voltage values comprise, for example, hard decision read values obtained by a plurality of read retries of the target cell at a plurality of reference voltages and/or soft values obtained from the flash memory device.

The adjusted quantized threshold voltage values are optionally used to determine reliability values. The adjusted quantized threshold voltage values are optionally applied to a soft decision decoder and/or a buffer. The interference amount, the reliability values and/or the adjustments to the quantized threshold voltage values are optionally obtained from one or more look-up tables.

A more complete understanding of the present invention, as well as further features and advantages of the present invention, will be obtained by reference to the following detailed description and drawings.

DETAILED DESCRIPTION

Various aspects of the invention are directed to signal processing and ECC techniques for mitigating ICI, noise and other distortions in memory devices, such as single-level cell or multi-level cell (MLC) NAND flash memory devices. As used herein, a multi-level cell flash memory comprises a memory where each memory cell stores two or more bits. Typically, the multiple bits stored in one flash cell belong to different pages. While the invention is illustrated herein using memory cells that store an analog value as a voltage, the present invention can be employed with any storage mechanism for flash memories, such as the use of voltages, currents or resistances to represent stored data, as would be apparent to a person of ordinary skill in the art.

According to one aspect of the invention, improved ICI mitigation techniques are provided that reduce ICI using soft information for a target cell obtained during a soft read retry procedure. According to another aspect of the invention, ICI mitigation techniques are provided for a given target cell that re-uses the soft information obtained during the soft read retry procedure for the target cell and performs additional reads only for aggressor cells.

Figure 1:
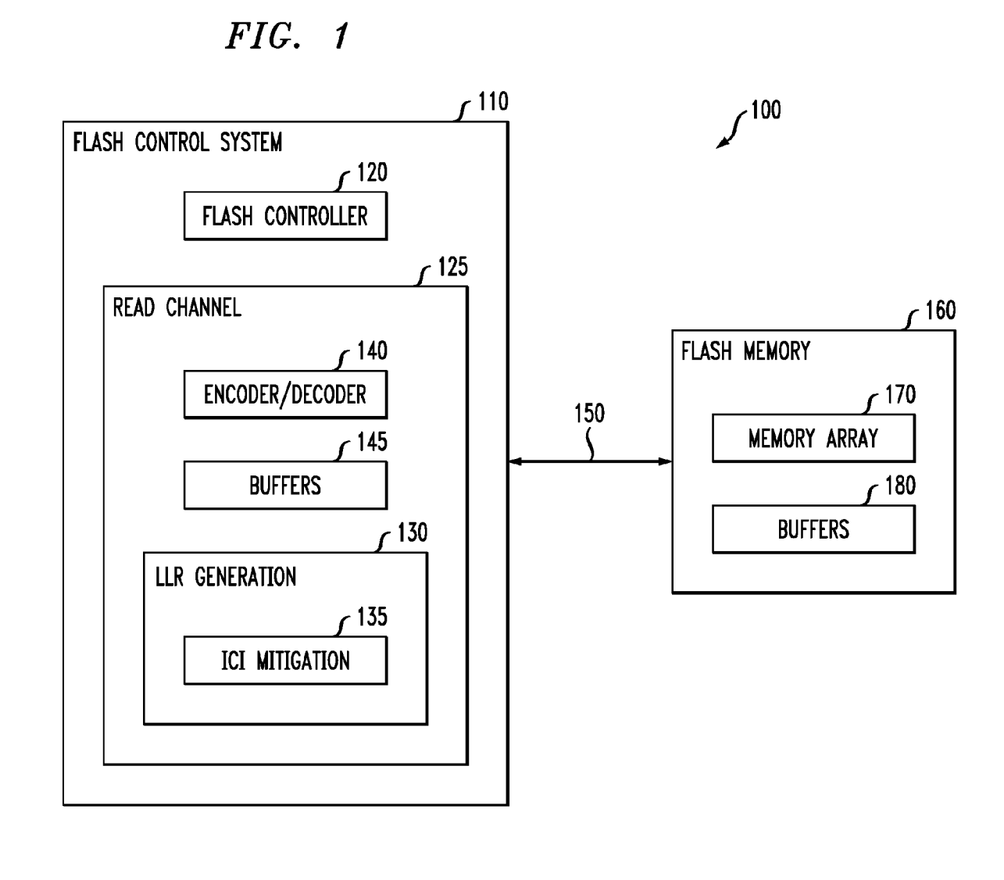
FIG. 1 is a schematic block diagram of an exemplary flash memory system incorporating detection and error correction techniques in accordance with the present invention.

FIG. 1 is a schematic block diagram of an exemplary flash memory system 100 incorporating detection and coding techniques in accordance with aspects of the present invention. As shown in FIG. 1, the exemplary flash memory system 100 comprises a flash control system 110 and a flash memory block 160, connected by an interface 150. The exemplary flash control system 110 comprises a flash controller 120, and a read channel 125. Moreover, the read channel 125 further comprises an encoder/decoder 140, buffers 145 and an LLR generation block 130. Finally, the LLR generation block 130 further comprises an ICI mitigation block 135.

As discussed further below in conjunction with FIGS. 7 and 9, for example, the exemplary flash controller 120 implements one or more detection and error correction coding/decoding processes that incorporate aspects of the present invention.

The exemplary read channel 125 comprises an encoder/decoder block 140 and one or more buffers 145. It is noted that the term "read channel" can encompass the write channel as well. In an alternative embodiment, the encoder/decoder block 140 and some buffers 145 may be implemented inside the flash controller 120. The encoder/decoder block 140 and buffers 145 may be implemented, for example, using well-known commercially available techniques and/or products, as modified herein to provide the features and functions of the present invention. As discussed hereinafter, the exemplary encoder/decoder block 140 comprises a soft-decision ECC decoder.

Generally, as discussed further below, the exemplary LLR generation block 130 processes one or more read values from the flash memory 160, such as single bit hard values and/or quantized multi-bit soft values, and generates reliability and/or LLR values that are applied to the decoder 140, such as an exemplary soft decision error correction code (ECC) decoder, such as a low density parity check (LPDC) decoder. In this disclosure, the terms reliability and LLR values are used interchangeably, and approximations of LLRs are included in this definition as well.

In the exemplary embodiment, the exemplary ICI mitigation block 135 is a function in the LLR generation block 130 that accounts for interference between physically adjacent cells in generating the LLR sequence.

The exemplary flash memory block 160 comprises a memory array 170 and one or more buffers 180 that may each be implemented using well-known commercially available techniques and/or products.

In various embodiments of the disclosed detection and coding/decoding techniques, the exemplary interface 150 may need to convey additional information relative to a conventional flash memory system, such as values representing information associated with aggressor cells. Thus, the interface 150 may need to have a higher capacity or faster rate than an interface in conventional flash memory systems. On the other hand, in other embodiments, this additional information is conveyed to flash controller 120 in a sequential manner which would incur additional delays. However those additional delays do not notably increase the overall delay due to their rare occurrence. When additional capacity is desired, the interface 150 may optionally be implemented, for example, in accordance with the teachings of International PCT Patent Application Serial No. PCT/US09/49328, filed Jun. 30, 2009, entitled "Methods and Apparatus for Interfacing Between a Flash Memory Controller and a Flash Memory Array", incorporated by reference herein, which increases the information-carrying capacity of the interface 150 using, for example, Double Data Rate (DDR) techniques.

During a write operation, the interface 150 transfers the program values to be stored in the target cells, typically using page or wordline level access techniques. For a more detailed discussion of exemplary page or wordline level access techniques, see, for example, International Patent Application Serial No. PCT/US09/36110, filed Mar. 11, 2009, entitled "Methods and Apparatus for Storing Data in a Multi-Level Cell Flash Memory Device with Cross-Page Sectors, Multi-Page Coding and Per-Page Coding," incorporated by reference herein.

During a read operation, the interface 150 transfers hard and/or soft read values that have been obtained from the memory array 170 for target and/or aggressor cells. For example, in addition to read values for the page with the target cell, read values for one or more neighboring pages in neighboring wordlines or neighboring even or odd bit lines are transferred over the interface 150. In the embodiment of FIG. 1, the disclosed detection and coding/decoding techniques are implemented outside the flash memory 160, typically in a process technology optimized for logic circuits to achieve the lowest area. It is at the expense, however, of the additional aggressor cell data that must be transferred on the interface 150.

Figure 2:
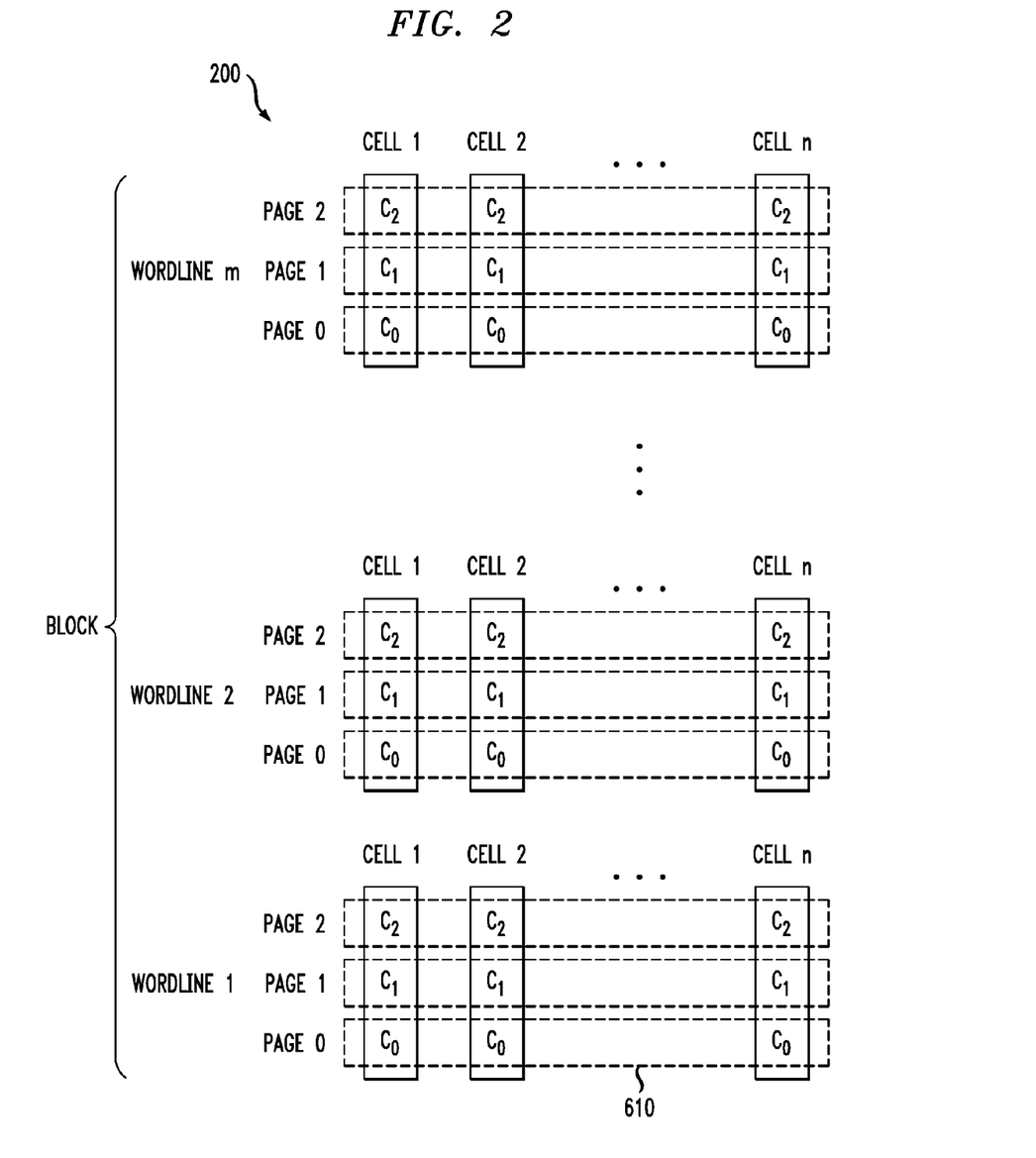
FIG. 2 illustrates an exemplary flash cell array in a multi-level cell (MLC) flash memory device in further detail.

FIG. 2 illustrates an exemplary flash cell array 200 in a multi-level cell (MLC) flash memory device 160 in further detail. As shown in FIG. 2, the exemplary flash cell array 200 stores three bits per flash cell, $c_i$. FIG. 2 illustrates the flash cell array architecture for one block, where each exemplary cell typically corresponds to a floating-gate transistor that stores three bits. The exemplary cell array 200 comprises m wordlines and n bitlines. Typically, in current multi-page cell flash memories, the bits within a single cell belong to different pages. In the example of FIG. 2, the three bits for each cell correspond to three different pages, and each wordline stores three pages. In the following discussion, pages 0, 1, and 2 are referred to as the lower, middle, and upper page levels within a wordline.

As indicated above, a flash cell array can be further partitioned into even and odd pages, where for example cells with even numbers (such as cells 2 and 4 in FIG. 2) correspond to even pages, and cells with odd numbers (such as cells 1 and 3 in FIG. 2) correspond to odd pages. In this case, a page (such as page 0) would contain an even page (even page 0) in even cells and an odd page (odd page 0) in odd cells.

In a two-level cell, for example, each cell stores two bits. In one exemplary implementation, Gray mapping {11, 01, 00, 10} is employed where bits in a cell belong to two different pages. The bits for the two pages in each cell are often referred to as the least significant bit (LSB) and the most significant bit (MSB). For example, if the bit pattern 01 is stored in a cell, "1" is the LSB corresponding to the lower page and "0" is the MSB corresponding to the upper page. In the exemplary embodiment, the lower page is programmed before the upper page. Experimental studies of flash memory devices indicate that for example the error event "01"→"10" (pattern "10" is read even though pattern "01" was written) has considerable occurrence probability at the end of device life. In addition, based on an additive white Gaussian noise (AWGN) model, the MSB page often exhibits a higher bit error rate (BER) compared to the LSB page. Thus, it has been found that reading one page improves the BER of the other.

Intercell Interference

Figure 3:
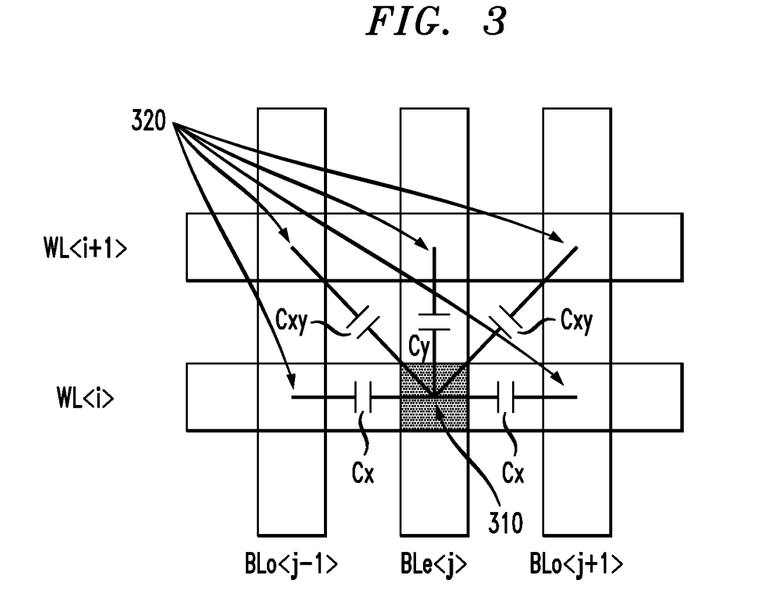
FIG. 3 illustrates the ICI that is present for a target cell due to the parasitic capacitance from a number of exemplary aggressor cells.

ICI is a consequence of parasitic capacitances between cells and is generally considered to be one of the most prominent sources of distortion in flash memories. FIG. 3 illustrates the ICI that is present for a target cell 310 due to the parasitic capacitance from a number of exemplary aggressor cells 320. The following notations are employed in FIG. 3:

WL: wordline;
BL: bitline;
BLo: odd bitline;
BLe: even bitline: and
C: capacitance.

Aspects of the present invention recognize that ICI is caused by aggressor cells 320 that are programmed after the target cell 310 has been programmed. The ICI changes the threshold voltage, $V_t$, of the target cell 310. Generally the threshold voltage of, $V_t$, of the target cell 310 is coupled by the threshold voltage changes of neighboring cells, such as the exemplary aggressor cells 320.

The interference pattern is related to the programming sequence. In one exemplary embodiment, a "bottom up" programming scheme is assumed and adjacent aggressor cells in wordlines i and i+1 cause ICI for the target cell 310. With such bottom-up programming of a block, ICI from the lower wordline i−1 is removed, and up to five neighboring cells contribute to ICI as aggressor cells 320, as shown in FIG. 3. It is noted, however, that the techniques disclosed herein can be generalized to cases where aggressor cells from other wordlines, such as wordline i−1, contribute to ICI as well, as would be apparent to a person of ordinary skill in the art. If aggressor cells from wordlines i−1, i and i+1 contribute to ICI, up to eight closest neighboring cells are considered. Other cells that are further away from the target cell can be neglected, if their contribution to ICI is negligible. In general, the aggressor cells 320 are identified by analyzing the programming sequence scheme (such as bottom up or even/odd techniques) to identify the aggressor cells 320 that are programmed after a given target cell 310.

The ICI caused by the aggressor cells 320 on the target cell 310 can be modeled in the exemplary embodiment as follows:

$$\Delta V_{ICI}^{(i,j)} = k_x \Delta V_t^{(i,j-1)} + k_x \Delta V_t^{(i,j+1)} + k_y \Delta V_t^{(i+1,j)} + k_{xy} \Delta V_t^{(i+1,j-1)} + k_{xy} \Delta V_t^{(i+1,j+1)} \quad (1)$$

where $\Delta V_t^{(w,b)}$ is the change in $V_t$ voltage of agressor cell (w,b), $\Delta V_{ICI}^{(i,j)}$ is the change in $V_t$ voltage of target cell (i,j) due to ICI and $k_x, k_y$ and $k_{xy}$ are capacitive coupling coefficients for the x, y and xy direction.

Generally, $V_t$ is the voltage representing the data stored on a cell and obtained during a read operation. $V_t$ can be obtained by a read operation, for example, as a soft voltage value with more precision than the number of bits stored per cell, or as a value quantized to a hard voltage level with the same resolution as the number of bits stored per cell (e.g., 3 bits for 3 bits/cell flash).

For a detailed discussion of ICI mitigation techniques, see, for example, International Patent Application Serial No. PCT/US09/49326, filed Jun. 30, 2009, entitled "Methods and Apparatus for Read-Side Intercell Interference Mitigation in Flash Memories," incorporated by reference herein.

Soft Read on Flash Memory

A NAND flash memory cell is a floating gate transistor. Depending on the charge amount on the floating gate, the threshold voltage (Vt) of the transistor may be different. By "programming" the cell, the floating gate charge amount is changed, thereby representing a certain amount of information to be stored in a non-volatile fashion. To read the information from the cell, a reference voltage (Vref or Vread) is applied to the control gate of the transistor. If Vref is higher than Vt, the transistor is turned on, otherwise the transistor is turned off, and therefore the information stored in the cell is detected by sensing the current flowing through the channel of the transistor. Thus, a flash memory is a hard-decision (HD) read since only one bit of information can be obtained from the on-off state of the transistor.

Figure 4:
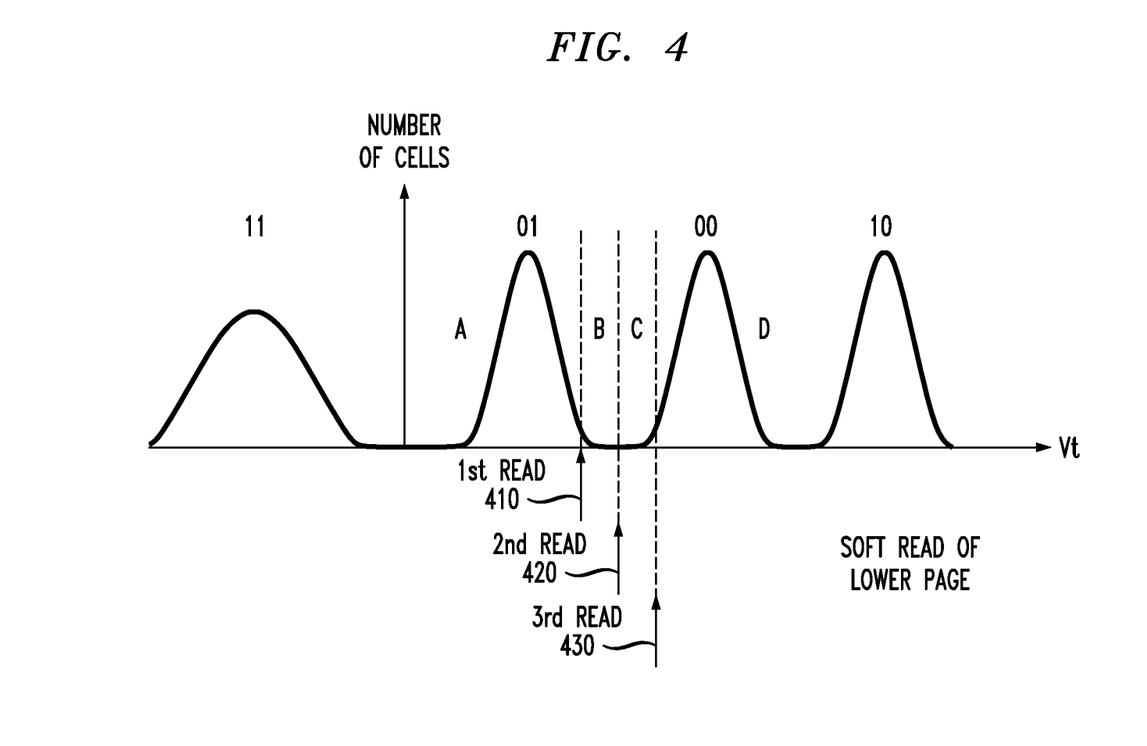
FIG. 4 illustrates an exemplary soft read operation with 3 hard decision reads on an exemplary lower page of a multi-level cell (MLC) device.

A "soft read" on a flash memory device 160 is comprised of multiple HD reads, usually with different Vrefs. FIG. 4 illustrates an exemplary soft read with 3 hard decision reads 410, 420, 430 on the lower page of an MLC device, such as device 160. Note that the three HD reads 410, 420, 430 can be initiated by the flash controller 110 or the flash memory device 160 itself if the device 160 has a built-in soft read command. A soft read operation divides the entire Vt region into a number of decision regions (e.g., regions A, B, C, D in FIG. 4), as discussed further below in conjunction with FIG. 8. Typically, a soft decision ECC decoder 140 is used in the flash controller 120 to leverage the soft information extracted from soft reads and to improve the read reliability of the flash memory.

System Model

Figure 5:
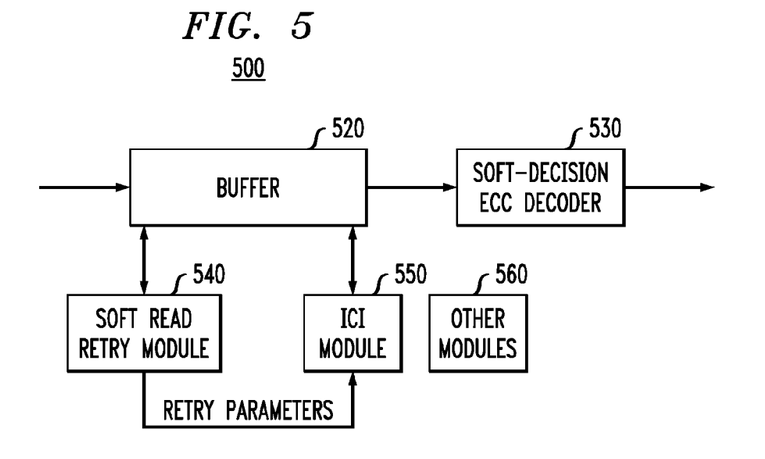
FIG. 5 is a schematic block diagram of an exemplary implementation of a flash controller incorporating aspects of the present invention.

Aspects of the present invention provide an ICI cancellation algorithm in the context of soft read retry. FIG. 5 is a schematic block diagram of an exemplary implementation of a flash controller 500 incorporating aspects of the present invention. The flash controller 500 receives hard and soft value inputs from flash devices (not shown in FIG. 5) and stores them in one or more buffers 520. The flash controller 500 further comprises a soft read retry module 540 and an ICI cancellation module 550. Since soft retry is in place, a soft-decision ECC decoder 530 is also employed. The exemplary soft-decision ECC decoder 530 processes decoder-specific soft inputs from the buffer 520 and generates decoded outputs, which are sent to other modules 560 in the controller 500 and eventually to the host if the decoding is successful. Depending on the type of soft-decision ECC decoder 530 that is employed, the soft input can be different. For example, if a Low Density Parity Check (LDPC) decoder is used, the soft input usually comprises LLR values (log likelihood ratios).

As previously indicate, flash memory devices 160 typically only support HD reads in on-the-fly read operations. Soft read operations are time consuming and are usually used only in retry or recovery modes. ICI cancellation requires additional reads from aggressor cells 320 and therefore is also a retry or recovery procedure. Typically, the disclosed ICI cancellation algorithm is initiated after soft read retry fails (or when soft read retry values are otherwise available). As discussed further below, the disclosed ICI cancellation algorithm receives soft retry parameters (such as Vrefs used for target cell retry and/or LLRs used in soft retry) as input, processes both hard read data of the target cell 310 and HD read data of the aggressor cells 320, and updates the soft decoder input (LLRs) in the buffer(s) 520.

In one exemplary embodiment, to minimize the number of additional reads in ICI cancellation, only aggressor cells 320 are read during ICI cancellation. Since ICI cancellation is initiated after soft retry, the soft read bits during soft retry are reused in ICI cancellation.

ICI Characteristics

To cancel the ICI, the amount of interference caused by the programming of aggressor cells 320 is identified using a process generally referred to as ICI characterization. ICI characterization can be done offline by the manufacturer of flash controller 500 before the product is shipped, or by a dedicated ICI characterization module in the flash controller 500 after the product has shipped. As shown by Equation (1), the overall interference is the sum of interference from a group of aggressor cells 320.

Figure 6:
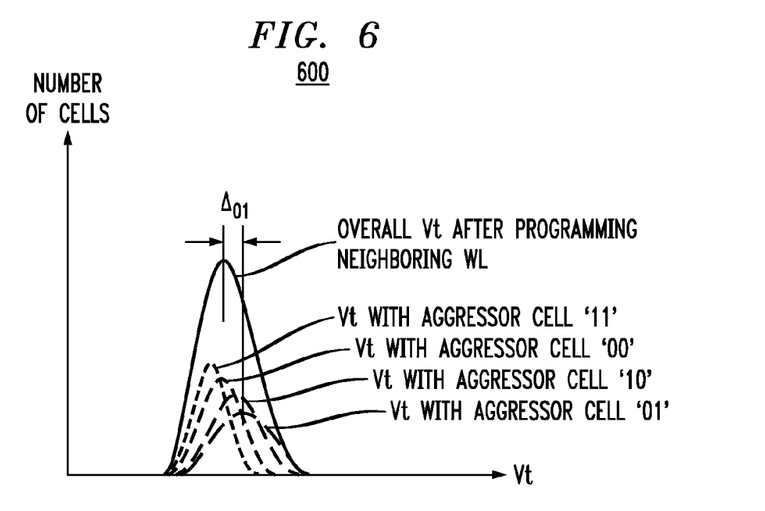
FIG. 6 illustrates an exemplary characterization of interference as a function of aggressor cell states.

For ICI cancellation, interference can be characterized as a function of the combination of aggressor cell states. FIG. 6 illustrates an exemplary characterization 600 of interference as a function of aggressor cell states, when there is only one aggressor cell 320 for each target cell 310. The amount of interference when the state of the aggressor cell 320 is "01" is characterized as $\Delta_{01}$. The characterization 600 can be extended to the case of multiple aggressor cells 320, as would be apparent to a person of ordinary skill in the art. For example, if a particular MLC flash memory layout leads to three aggressor cells 320 per target cell 310, there are in total 64(4^3) combinations of aggressor cell states.

ICI Cancellation

Figure 7:
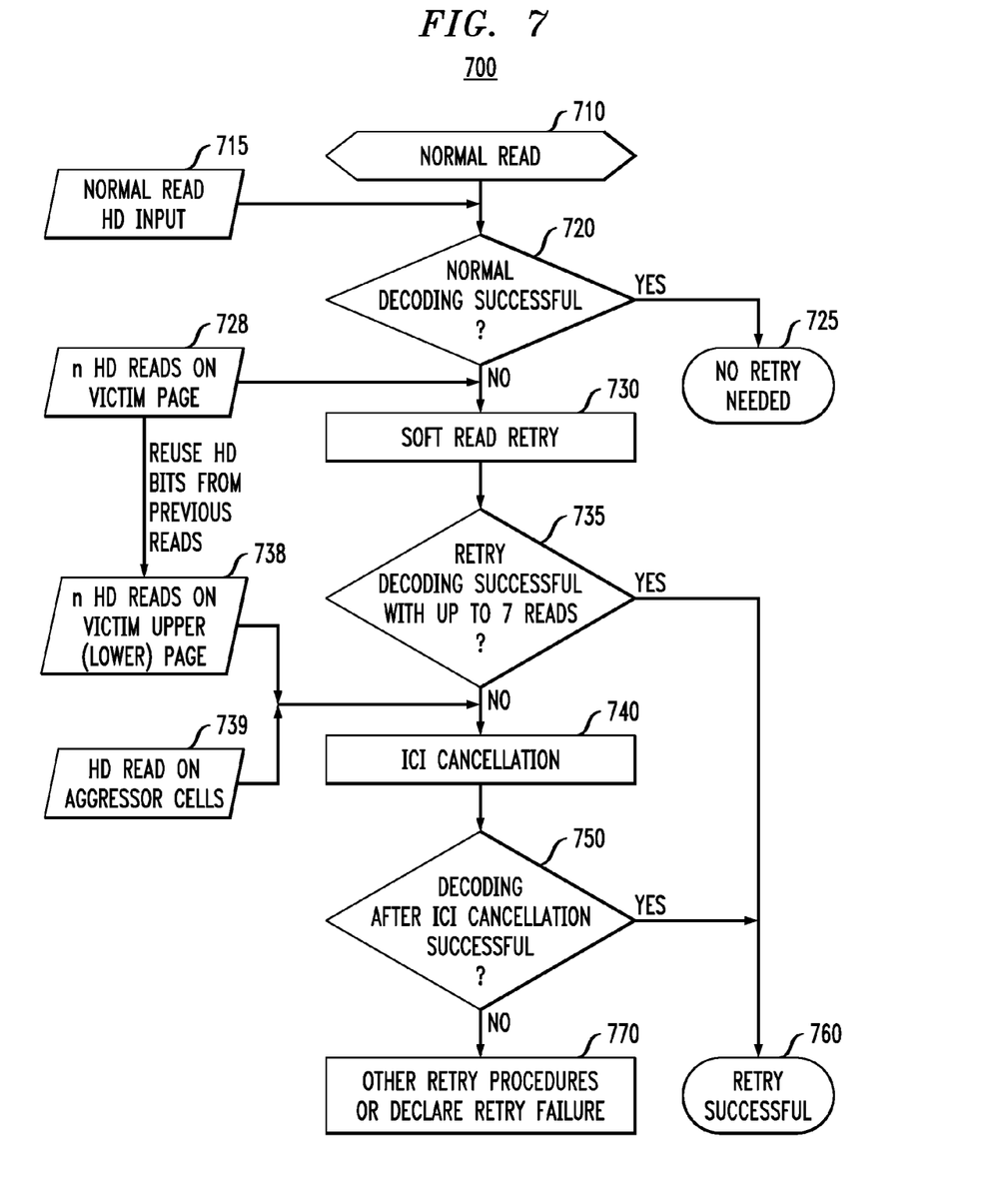
FIG. 7 is a flow chart illustrating an exemplary detection and decoding process that performs ICI cancellation after a soft retry procedure.

FIG. 7 is a flow chart illustrating an exemplary detection and decoding process 700 that performs ICI cancellation after a soft retry procedure. To obtain the analog Vt of each cell for cancelation involves many reads and incurs a large performance penalty. Thus, an exemplary implementation of the ICI cancellation process 600 reuses the soft information for the target cell 310 obtained during a soft read retry. After the soft read, the entire Vt region of the target cell 310 is divided into a number of soft-decision regions, as discussed further below in conjunction with FIG. 8, where each region can be assigned a unique S-index corresponding to the quantized threshold voltage Vt, which becomes the soft decision data to be utilized by the ICI cancellation process 900, as discussed further below in conjunction with FIG. 9.

As shown in FIG. 7, the exemplary detection and decoding process 700 initially performs a normal read operation during step 710.

A test is performed during step 720 to determine if the normal decoding was successful, using the normal read hard decision input 715. If it is determined during step 720 that the normal decoding was successful, then no retry is needed during step 725. If, however, it is determined during step 720 that normal decoding was not successful, then a soft read retry process is initiated during step 730, using n HD reads on the target page 728.

A further test is performed during step 725 to determine if the retry decoding was successful with up to 7 reads (or another configurable number of reads). For example, a soft-decision ECC decoder can be used when soft read retry and ICI cancellation are applied. As discussed further below, the S-index is mapped to a soft-decision metric that is suitable for the soft-decision ECC decoder. Typically, LLRs are used as a soft-decision metric input to the soft-decision ECC decoder, such as an low density parity check (LDPC) decoder. As discussed further below in conjunction with FIG. 12, since there are a limited number of possible S-indices, this mapping can be done using a look-up table (LUT), referred to as an LLR LUT.

If it is determined during step 735 that the retry decoding was successful, then the retry is declared as successful during step 760. If, however, it is determined during step 735 that the retry decoding was not successful, then an ICI cancellation process is initiated during step 740, as discussed further below in conjunction with FIG. 9, using the n HD reads on the target upper (or lower) page 738 (based on the n HD reads 728 on the target page 310 from the soft retry process and HD reads 739 on the aggressor cells 320.

A test is performed during step 750 to determine if decoding is successful after ICI cancellation. If it is determined during step 750 that decoding is successful, then the retry is declared as successful during step 760. If, however, it is determined during step 750 that decoding is not successful, then other retry procedures are attempted during step 770 or a retry failure is declared.

A indicated above, after the soft read, the entire Vt region of the target cell 310 is divided into a number of soft-decision regions, where each region can be assigned a unique index (S-index) corresponding to the quantized threshold voltage Vt, which becomes the soft decision data to be utilized by the ICI cancellation process 900.

Figure 8:
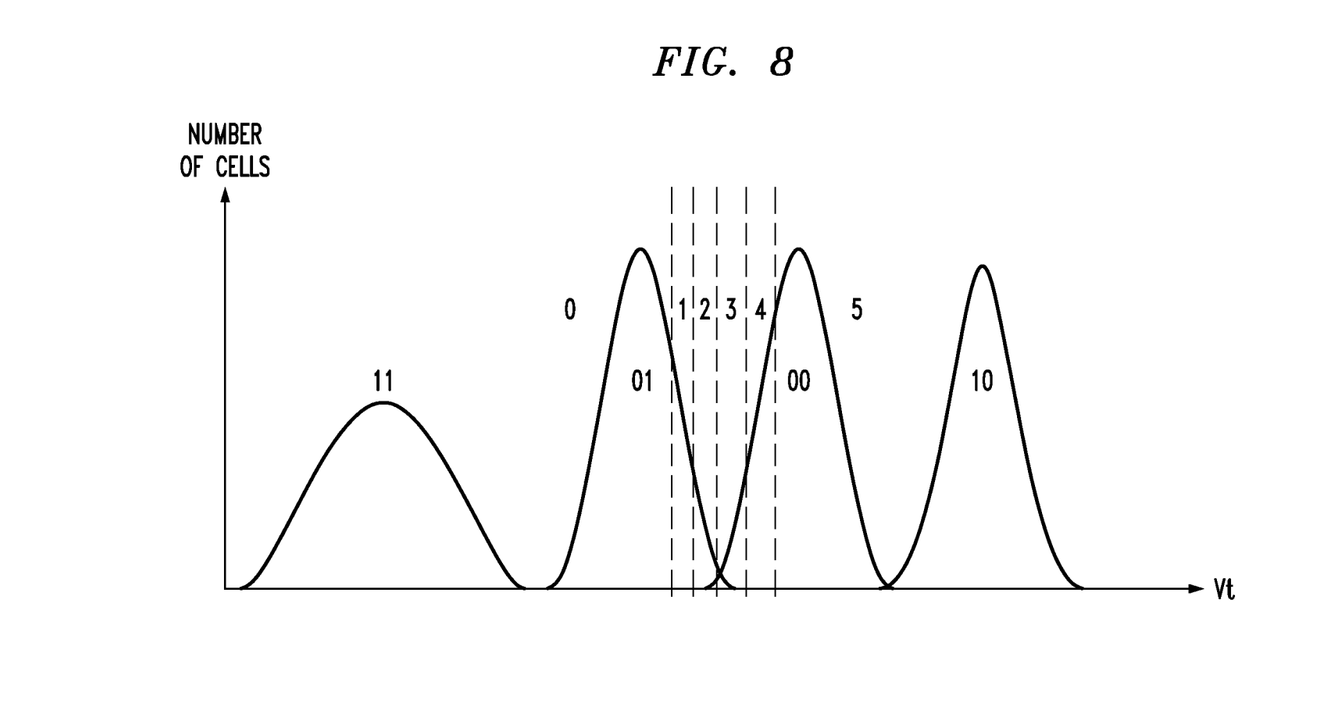
FIG. 8 shows an example of S-indices after 5 soft reads for the lower page in an exemplary MLC flash memory.

FIG. 8 shows an example of S-indices after 5 soft reads for the lower page in an exemplary MLC flash memory. Note that each decision region 0-5 may have a different width ($h_i$, i=0, 1, . . . , 5). The S-index information obtained during soft read retry is a quantized version of the analog Vt value. The exemplary embodiment assigns S-indices to decision regions in an ascending order of Vt (although other variations are possible).

Figure 9:
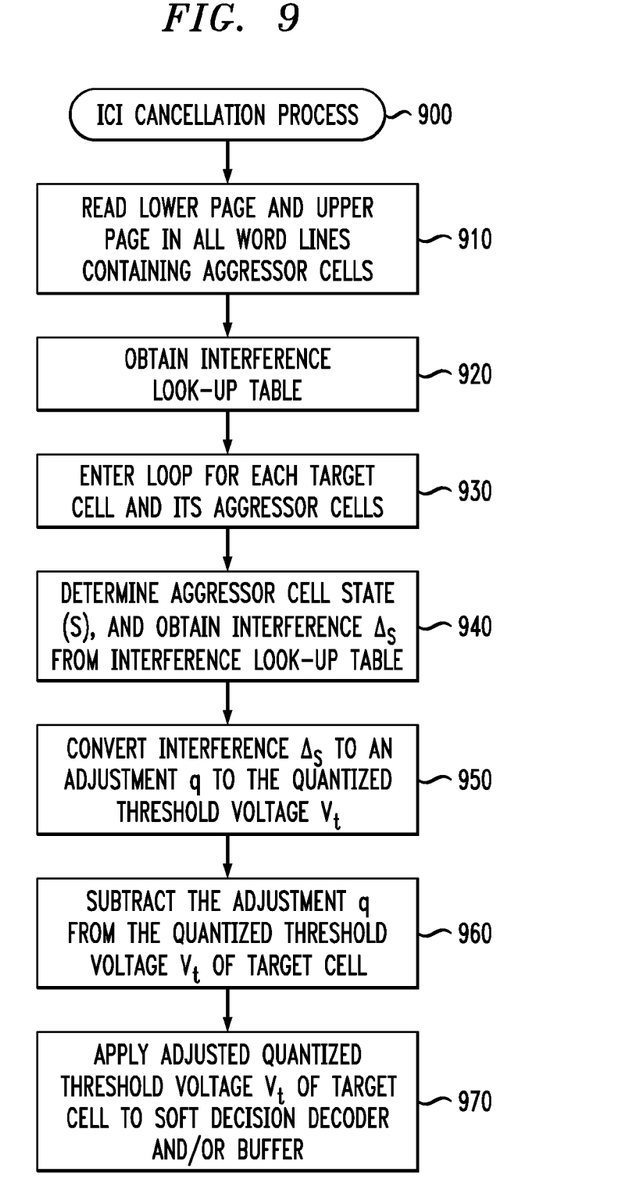
FIG. 9 is a flow chart illustrating an exemplary ICI Cancellation process that incorporates aspects of the present invention for an exemplary MLC flash memory.

FIG. 9 is a flow chart illustrating an exemplary ICI Cancellation process 900 that incorporates aspects of the present invention for an exemplary MLC (2 bits per cell) flash memory. As shown in FIG. 9, the exemplary ICI Cancellation process 900 initially reads the lower page and upper page in all word lines containing aggressor cells 320 of the target cell 310 during step 910.

The exemplary ICI Cancellation process 900 then obtains an interference look-up table (LUT) during step 920 and loaded into memory. Since the relative locations of aggressor cells are fixed for one device, a pre-defined LUT (obtained through ICI characterization) is used to store the interference (A) conditioned upon each combination of aggressor cell states. For example, if there are three aggressor cells 320 for each target cell 310, i.e., there are 4^3=64 entries in the LUT.

The exemplary ICI Cancellation process 900 enters into a loop during step 930 for each target cell 310 and its aggressor cells 320. The aggressor cell state (S is determined during step 940 and the corresponding interference $\Delta_S$ is obtained from the interference look-up table. In particular, the combination of aggressor cell states (S) around this target cell 310 is determined and the LUT is used to retrieve the interference $\Delta_S$. Without loss of generality, one aggressor cell is used as an example. Let the aggressor cell state be "01" and the corresponding interference is $\Delta_{01}$.

The interference $\Delta_S$ is converted to an adjustment q to the quantized threshold voltage $V_t$(S-index) during step 950. The adjustment (q) to the S-index of the target cell 310 is determined based on the target cell's S-index (i) before ICI cancellation and the width of this decision region ($h_i$). For example, if the S-index belongs to the trunk region of Vt distribution (e.g., indexes i of 0 or 5), then the S-index is left unchanged, as follows:

$q=0$.

If, however, the S-index belongs to the tail region of Vt distribution (e.g., indexes i of 1-4), then the S-index is adjusted. If the width h of each region is uniform, then the adjustment q can be obtained by dividing the interference $\Delta_S$ by the width h. If, however, the width h of each region is not uniform, then the adjustment q can be obtained as follows:

for k= $q_{min}$ to $q_{max}$
  if $|\Delta_S| \geq \alpha_k \Sigma_{j=i-k+1}^{i} h_j$ and $|\Delta_S| < \alpha_{k+1} \Sigma_{j=i-k}^{i} h_j$
    q = k;
    Break;
end Generally, the interference $\Delta_S$ is quantized based on the width of the region i and its neighboring regions. In this step, $q_{min}$ and $q_{max}$ are the configurable minimum and maximum change in S-index allowed by the controller 120. They can be chosen based on the maximum number of reads on target cells allowed by the controller 120, and the maximum amount of ICI that can be expected. In this example, for a maximum 5-read soft retry, an example choice of the range of q can be [−1, 2]. The coefficients ($\alpha_k$, $k \in [q_{min}, q_{max}]$) are chosen, for example, to optimize ICI cancellation performance, such as setting the coefficients to 1.0.

During step 960, the Adjustment q is subtracted from the quantized threshold voltage $V_t$ of target cell 310 (e.g., the target cell's S-index (i)). The updated S-index after ICI cancellation becomes i−q. If the updated S-index is out of range, the updated S-index can be saturated to the S-index of the nearest trunk region (0 or 5 in this example).

The adjusted quantized threshold voltage $V_t$ of the target cell 310 is applied to a soft decision decoder and/or buffer during step 970. As discussed further below in conjunction with FIG. 12, the target cell's S-index is applied to the LLR LUT used in 5-read soft retry and the target cell's LLR is written to a buffer or directly to the decoder. As indicated above, a soft-decision ECC decoder can be used when soft read retry and ICI cancellation is applied. The S-index is mapped to a soft-decision metric that is suitable for the decoder. Typically, an LLR is used as a soft-decision metric input to the decoder, such as a LDPC decoder. Since there are only a limited number of possible S-indices, this mapping can be done through the LLR LUT.

Figure 10:
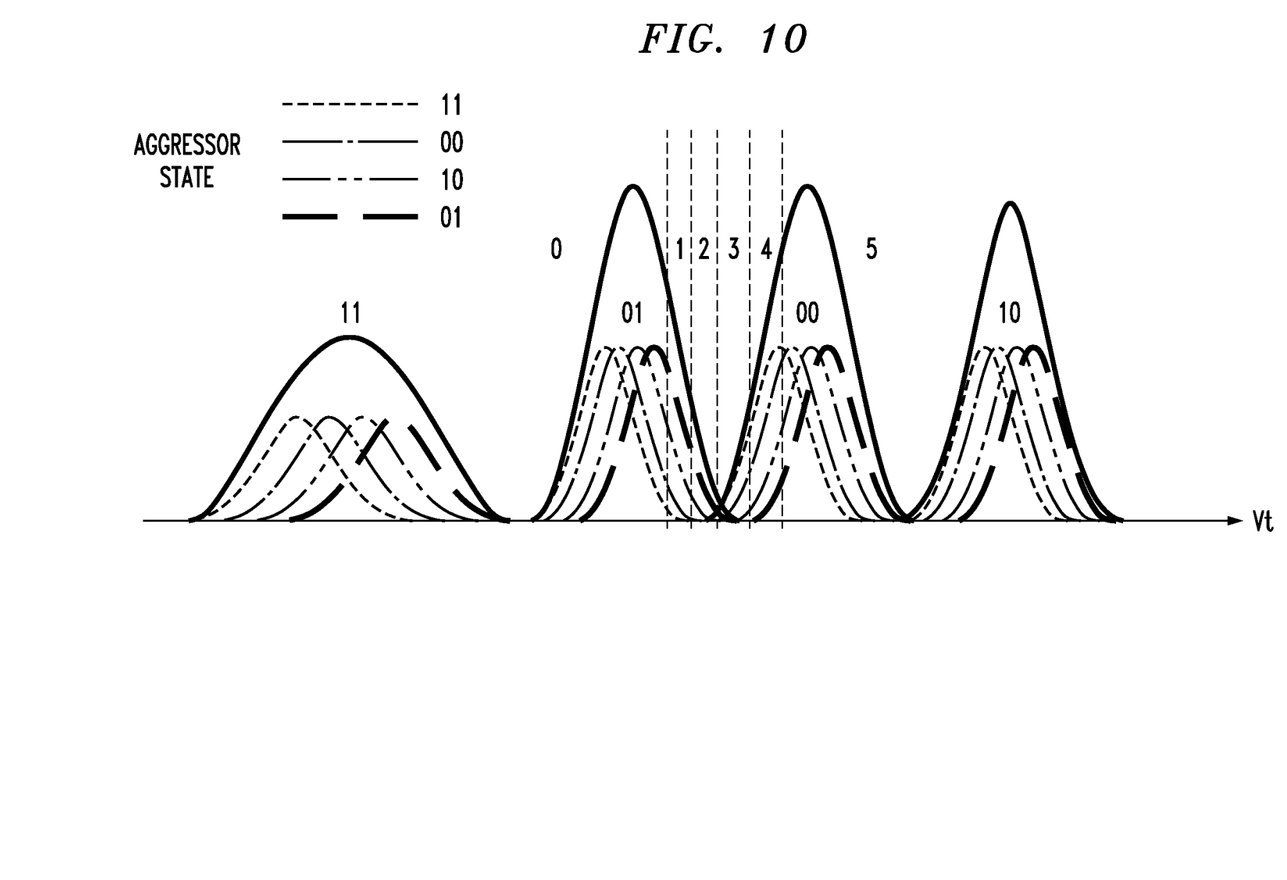
FIG. 10 shows an example of S-indices after 5 soft reads for the lower page in an exemplary MLC flash memory.

FIG. 10 shows an example of S-indices after 5 soft reads for the lower page in an exemplary MLC flash memory. For example, if an aggressor state (S) is read as "01" then the corresponding interference $\Delta_{01}$ can be loaded from a predefined LUT. If the target cell has an S-index 0 or 5 in the trunk region, then the S-index is maintained without adjustment and ICI cancelation is not required. If the target cell has S-index 2, and $\Delta_S \geq \alpha_1 h_2$ and $\Delta_S < \alpha_2(h_2+h_1)$, then q=1.

It is noted that Vrefs used in soft read retry can be arbitrarily placed. Therefore, the widths of different decision regions ($h_i$, i=0, 1, . . . , 5) can be different. For example, $h_2 \neq h_1$. The S-index information obtained during soft read retry is a quantized version of the analog Vt value.

Figure 11:
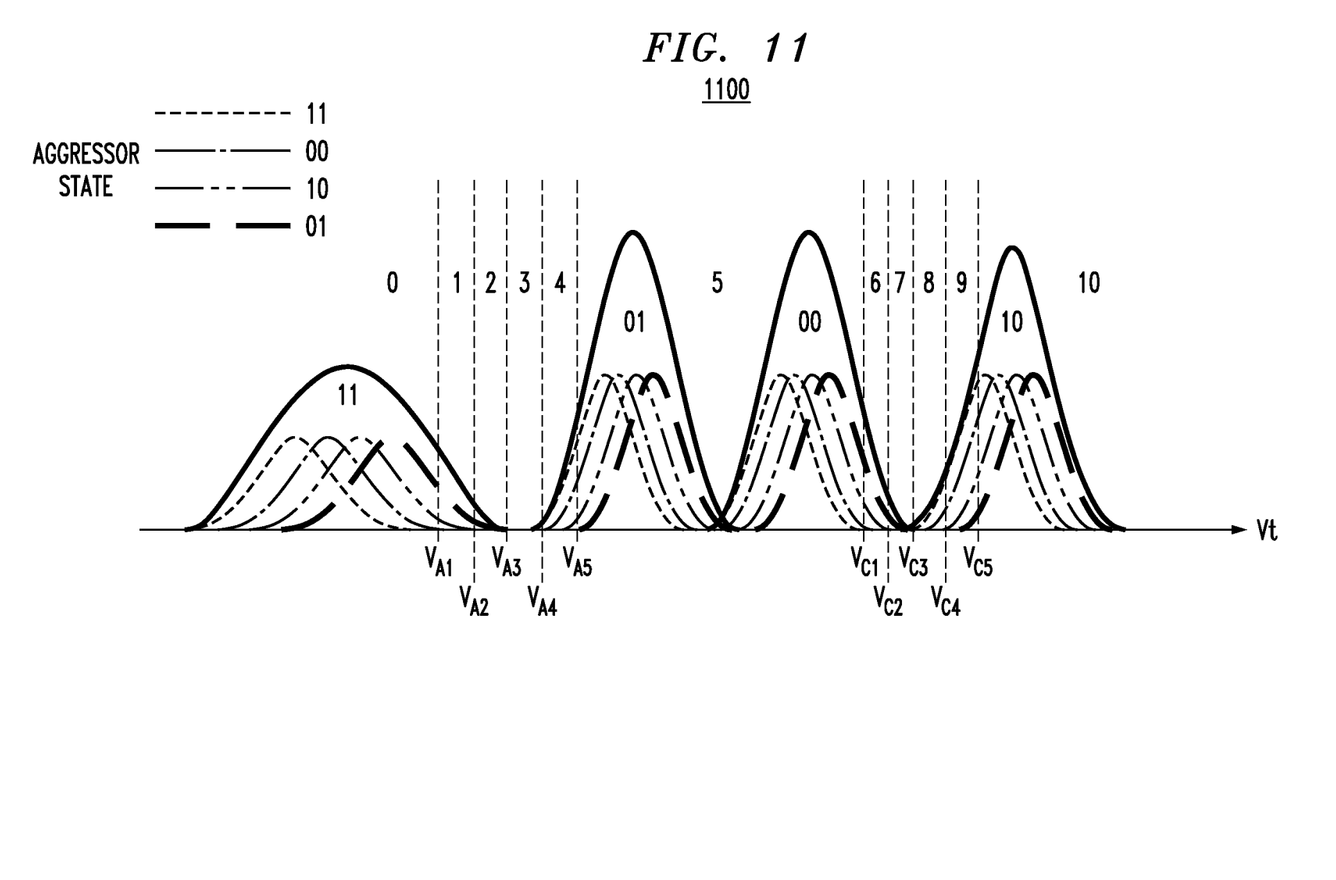
FIG. 11 shows an example of S-indices after 5 soft reads for the upper page in an exemplary MLC flash memory.

FIG. 11 shows an example of S-indices after 5 soft reads for the upper page in an exemplary MLC flash memory. Aspects of the present invention can also be applied to an SLC device and pages in TLC devices. The maximum S-index becomes 10. The trunk regions in FIG. 11 are 0, 5, and 10. In this case, the interference $\Delta_S$ may be different in the lower half region (S-index=1, 2, 3, 4) than in the upper half region (S-index=6, 7, 8, 9). Both ICI characterization and ICI cancellation can take care of it by using separate interferences for different Vt regions. This also indicates that the ICI cancellation process 900 should use separate interference values for lower page ICI cancellation and upper page ICI cancellation.

Steps 940-970 of the exemplary ICI Cancellation process 900 are applied to each target cell 310 in the page/word line. There are typically multiple kilobytes of data in a page or ECC codeword that is to be recovered, while there are only a limited number of S-indices and aggressor cell states (S). Therefore, an embodiment of the invention recognizes that it can be more computationally efficient to pre-compute step 950 for each possible S-index and combination of aggressor cell states and to store the results (q as a function of S and i) in a LUT, called the ICI LUT. In the exemplary case of lower page ICI with a maximum 5 read soft retry, there are up to 6 different S-indices, and up to $4^5=1024$ combinations of aggressor states if there are up to 5 aggressor cells per target cell (as shown in FIG. 3). Then, the ICI LUT has 1024×6=6144 entries. Since it is known that the two S-indices (0 and 5) that represent trunk regions are not going to be changed, a simple logic can be used to bypass ICI cancellation for these two S-indices, and the size of the ICI LUT can be reduced to 1024−(6−2)=4096 entries.

Figure 12:
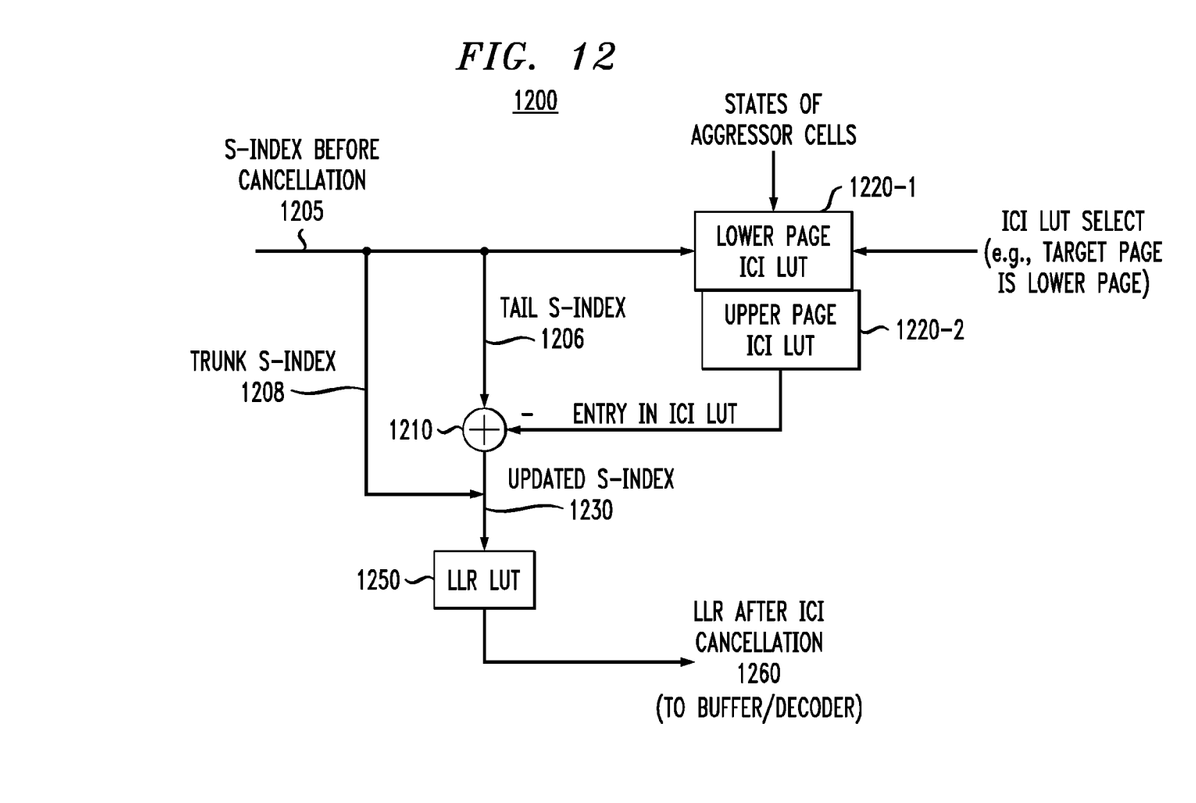
FIG. 12 illustrates an embodiment for an ICI mitigation block for an exemplary MLC.

FIG. 12 illustrates an embodiment for an ICI mitigation block 1200 for an exemplary MLC, where the lower page and upper page have different ICI LUT's. As shown in FIG. 12, the S-index i before cancellation 1205 is applied to the block 1200. If the applied S-index i corresponds to a tail S-index 1206, then it is applied in parallel to an adder 1210 and to the ICI LUTs 1220-1, 1220-2 for the lower and upper pages. If, however, the applied S-index i corresponds to a trunk S-index 1208, then it is applied directly to an LLR LUT 1250.

The tail S-index 1206 is applied to the ICI LUTs 1220-1, 1220-2, which store the S-index adjustment q for each possible S-index and combination of aggressor cell states 1215 (q is stored as a function of S and i). The ICI LUTs 1220-1, 1220-2 are controlled by an ICI LUT select signal (e.g., the target page is the lower page).

The indexed q entry from the ICI LUT is also applied to the adder 1210 with the tail S-index 1206 to obtain the updated S-index 1230.

The trunk S-index 1208 and the updated S-indices 1230 are applied to an LLR LUT 1250 to obtain an updated LLR after ICI cancellation 1260, which can be applied to a buffer and/or soft decision decoder, as discussed above.

Figure 13:
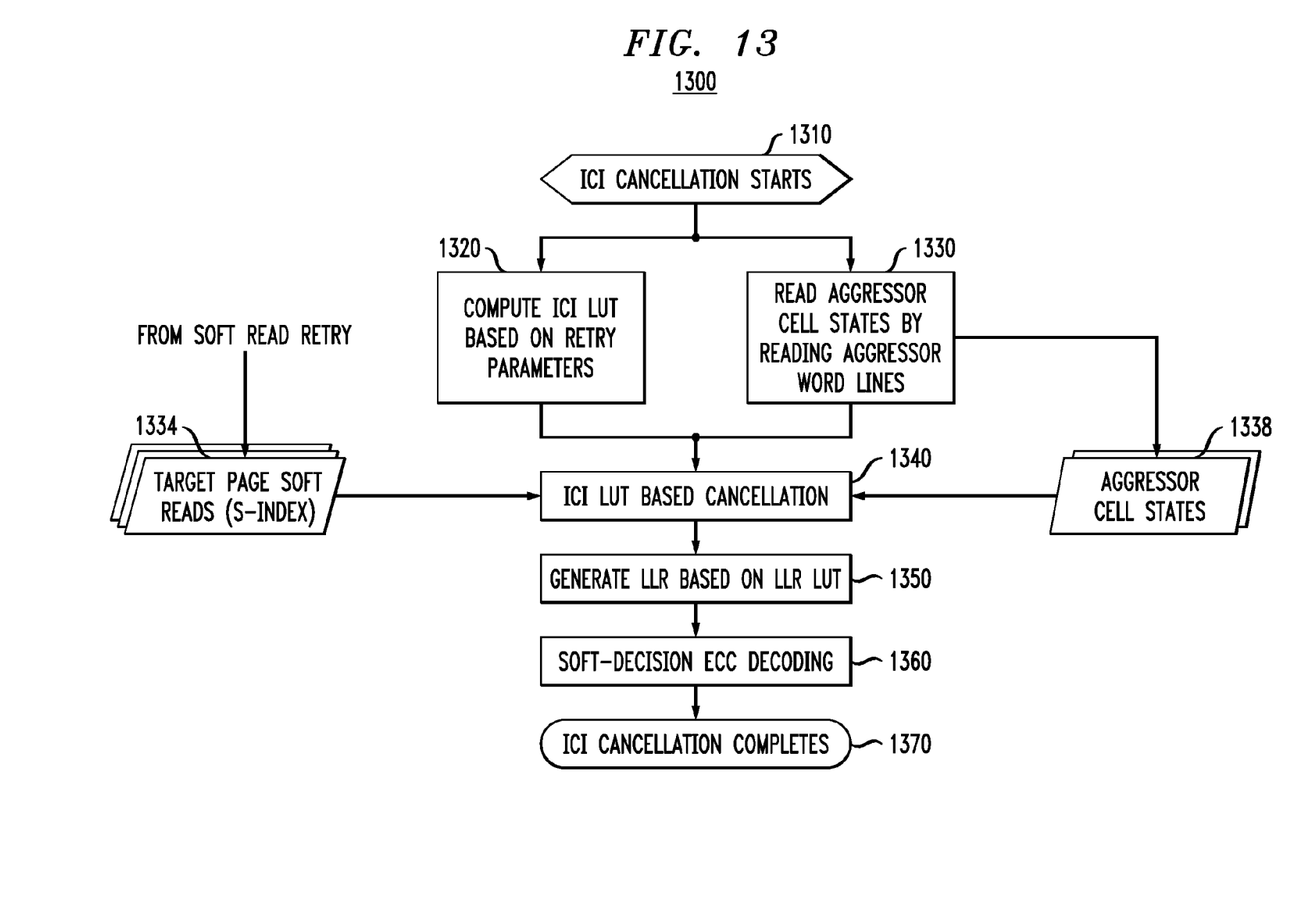
FIG. 13 is a flow chart illustrating an exemplary ICI cancellation process that incorporates aspects of the present invention for an exemplary MLC flash memory having a plurality of aggressor cells for each target cell.

FIG. 13 is a flow chart illustrating an exemplary ICI cancellation process 1300 that incorporates aspects of the present invention for an exemplary MLC (2 bits per cell) flash memory having a plurality of aggressor cells 320 for each target cell 310. If ICI characterization reveals that both horizontal neighbors and a vertical neighbor of a target cell 310 contributes the ICI due to coupling capacitance ($2*C_x+C_y$), while the diagonal coupling capacitance ($C_{xy}$) is negligible, then there are 3 aggressor cells 320. For MLC (2 bits per cell), then there are a total of $4^3=64$ combinations of aggressor states. Each combination of aggressor states is a 6-bit vector (e.g, S="01 10 11"), representing the hard-decision data read from the 3 aggressor cells. Each unique value of S corresponds to a value of interference that is characterized. During ICI cancellation, a 64×M entry ICI LUT is computed, where M is the maximum number of tail (i.e., non-trunk) S-indices that is generated by soft read, which depends on the number reads in soft retry and whether it's an upper page or lower page.

As shown in FIG. 13, when ICI cancellation is initiated during step 1310, the controller issues reads for aggress cell states in the form of aggressor pages (lower and upper) during step 1330. In the meantime, ICI LUT is computed during step 1320 based on retry parameters and ICI characteristics. ICI LUT based cancellation is performed during step 1340 using soft reads (S-index) 1334 for the target page 310 as well as the aggressor cell states 1338.

The exemplary ICI cancellation process 1300 generates LLR based on the LLR LUT 1250 during step 1350 and soft-decision ECC decoding is performed during step 1360. The ICI cancellation process completes during step 1370.

It is noted that in the exemplary embodiments, retry parameters are used, including the Vrefs used in soft-read retry and consequently the decision region width information. However, channel information such as the Vt distribution is not used. Thus, the disclosed scheme is suitable for systems where channel information may not be readily available when ICI is initiated. In addition, the disclosed scheme does not require write-side compensation.

Process, System and Article of Manufacture Details

While a number of flow charts herein describe an exemplary sequence of steps, it is also an embodiment of the present invention that the sequence may be varied. Various permutations of the algorithm are contemplated as alternate embodiments of the invention. While exemplary embodiments of the present invention have been described with respect to processing steps in a software program, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

We claim:

1. A method for processing data from a flash memory device, comprising:
   obtaining one or more quantized threshold voltage values for at least one target cell of said flash memory device;
   obtaining one or more hard decision read values for at least one aggressor cell of said target cell;
   determining an aggressor state of said at least one aggressor cell;
   determining an interference amount based on said aggressor state;
   determining an adjustment to said one or more quantized threshold voltage values based on said determined interference amount; and
   adjusting said one or more quantized threshold voltage values based on said determined adjustment.

2. The method of claim 1, wherein said one or more quantized threshold voltage values for at least one target cell are re-used from a previous soft read retry operation.

3. The method of claim 1, wherein said one or more quantized threshold voltage values comprises one or more of hard decision read values obtained by a plurality of read retries of said target cell at a plurality of reference voltages and soft values obtained from said flash memory device.

4. The method of claim 1, further comprising the step of determining one or more reliability values based on said one or more adjusted quantized threshold voltage values.

5. The method of claim 4, wherein one or more of said interference amount and said one or more reliability values are obtained from a look-up table.

6. The method of claim 1, further comprising the step of applying said one or more adjusted quantized threshold voltage values to one or more of a soft decision decoder and a buffer.

7. The method of claim 1, wherein said adjustment is set to zero if said one or more quantized threshold voltage values correspond to a trunk region of a threshold voltage distribution.

8. The method of claim 1, wherein said adjustment is obtained by dividing said interference amount by a region size of a threshold voltage distribution.

9. The method of claim 1, wherein said adjustment is obtained by quantizing said interference amount based on a width of one or more regions of a threshold voltage distribution.

10. The method of claim 1, wherein said adjustment to said one or more quantized threshold voltage values is obtained from an inter-cell interference look-up table.

11. A tangible machine-readable recordable storage medium for processing data from a flash memory device, wherein one or more software programs when executed by one or more processing devices implement the steps of the method of claim 1.

12. A flash memory system, comprising:
an intercell interference mitigation block configured to:
obtain one or more quantized threshold voltage values for at least one target cell of said flash memory device;
obtain one or more hard decision read values for at least one aggressor cell of said target cell;
determine an aggressor state of said at least one aggressor cell;
determine an interference amount based on said aggressor state;
determine an adjustment to said one or more quantized threshold voltage values based on said determined interference amount; and
adjust said one or more quantized threshold voltage values based on said determined adjustment.

13. The flash memory system of claim 12, wherein said one or more quantized threshold voltage values for at least one target cell are re-used from a previous soft read retry operation.

14. The flash memory system of claim 12, wherein said one or more quantized threshold voltage values comprises one or more of hard decision read values obtained by a plurality of read retries of said target cell at a plurality of reference voltages and soft values obtained from said flash memory device.

15. The flash memory system of claim 12, wherein said intercell interference mitigation block is further configured to determine one or more reliability values based on said one or more adjusted quantized threshold voltage values.

16. The flash memory system of claim 15, wherein one or more of said interference amount and said one or more reliability values are obtained from a look-up table.

17. The flash memory system of claim 12, wherein said intercell interference mitigation block is further configured to apply said one or more adjusted quantized threshold voltage values to one or more of a soft decision decoder and a buffer.

18. The flash memory system of claim 12, wherein said adjustment is obtained by dividing said interference amount by a region size of a threshold voltage distribution.

19. The flash memory system of claim 12, wherein said adjustment is obtained by quantizing said interference amount based on a width of one or more regions of a threshold voltage distribution.

20. The flash memory system of claim 12, wherein said adjustment to said one or more quantized threshold voltage values is obtained from an inter-cell interference look-up table.

* * * * *